United States Patent
Oh et al.

(10) Patent No.: US 9,093,145 B2
(45) Date of Patent: Jul. 28, 2015

(54) NON-VOLATILE RANDOM ACCESS MEMORY DEVICE AND DATA READ METHOD THEREOF

(71) Applicants: Eun Chu Oh, Hwaseong-Si (KR); JunJin Kong, Yongin-Si (KR); Hong Rak Son, Anyang-Si (KR); Younggeon Yoo, Seoul (KR)

(72) Inventors: Eun Chu Oh, Hwaseong-Si (KR); JunJin Kong, Yongin-Si (KR); Hong Rak Son, Anyang-Si (KR); Younggeon Yoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/141,609

(22) Filed: Dec. 27, 2013

(65) Prior Publication Data

US 2014/0185361 A1    Jul. 3, 2014

(30) Foreign Application Priority Data

Dec. 27, 2012  (KR) .................. 10-2012-0155060

(51) Int. Cl.
  *G11C 7/00* (2006.01)
  *G11C 13/00* (2006.01)
(52) U.S. Cl.
  CPC .......... *G11C 13/004* (2013.01); *G11C 13/0002* (2013.01)
(58) Field of Classification Search
  CPC .............................. G11C 13/0069; G11C 7/00
  USPC ............................................ 365/148, 189.16
  See application file for complete search history.

(56) References Cited

U.S. PATENT DOCUMENTS

| 5,969,979 | A | 10/1999 | Hirano |
| 6,438,035 | B2 | 8/2002 | Yamamoto et al. |
| 6,590,820 | B2 | 7/2003 | Nakagawa |
| 6,760,251 | B2 * | 7/2004 | Hidaka .................... 365/171 |
| 6,781,873 | B2 * | 8/2004 | Ishikawa et al. ........... 365/158 |
| 6,961,264 | B2 | 11/2005 | Tsuchida |
| 7,027,325 | B2 | 4/2006 | Iwata |
| 7,103,706 | B1 | 9/2006 | Van Buskirk et al. |
| 7,830,705 | B2 | 11/2010 | Jeong |
| 7,872,911 | B2 | 1/2011 | Sarin et al. |
| 7,936,588 | B2 | 5/2011 | Liu et al. |
| 8,023,311 | B2 | 9/2011 | Kim et al. |
| 8,036,015 | B2 | 10/2011 | Ueda et al. |
| 2010/0061141 | A1 | 3/2010 | Hwang |
| 2010/0208511 | A1 * | 8/2010 | Rhie et al. .................. 365/148 |
| 2010/0321976 | A1 | 12/2010 | Jung et al. |
| 2011/0157971 | A1 * | 6/2011 | Kim et al. .................. 365/171 |
| 2011/0310657 | A1 * | 12/2011 | Kim et al. .................. 365/148 |

FOREIGN PATENT DOCUMENTS

| JP | H09270195 A | 10/1997 |
| JP | 201020818 A | 1/2010 |
| KR | 1020000012867 A | 3/2000 |
| KR | 100370153 A | 11/2001 |
| KR | 100905188 A | 6/2009 |
| KR | 1020120027540 A | 3/2012 |

* cited by examiner

*Primary Examiner* — Michael Tran
(74) *Attorney, Agent, or Firm* — Volentine & Whitt, PLLC

(57) ABSTRACT

A nonvolatile random access memory device includes a plurality of memory cells configured to store data therein, a plurality of reference cells separate from the memory cells, the reference cells each configured to output a corresponding reference cell signal, and a read/write circuit. The read/write circuit is configured to generate from the reference cell signals a reference signal which is variable to have a plurality of different reference levels. The read/write circuit is further configured to identify, in response to the reference signal, a logic state among a first logic state and a second logic state for each of one or more selected memory cells, and to output read data corresponding to the identified logic state.

17 Claims, 17 Drawing Sheets

NON-VOLATILE RANDOM ACCESS MEMORY DEVICE AND DATA READ METHOD THEREOF

CROSS-REFERENCE TO RELATED APPLICATIONS

This U.S. non-provisional patent application claims priority under 35 USC §119 to Korean Patent Application No. 10-2012-0155060, filed on Dec. 27, 2012, the entirety of which is hereby incorporated by reference.

BACKGROUND OF THE INVENTION

Exemplary embodiments of the inventive concepts relate to semiconductor devices and, more particularly, to a nonvolatile random access memory including a reference cell and a data read method thereof.

In general, semiconductor memory devices are classified into volatile memory devices and nonvolatile memory devices. Volatile memory devices have high read/write speed but lose their stored data when their power supplies are interrupted. On the other hand, nonvolatile memory devices retain their stored data even when their power supplies are interrupted. Therefore, the nonvolatile memory devices are used to store data that must be retained regardless of power supply.

Recently, there is an increasing demand for nonvolatile semiconductor memory devices that are capable of implementing high density and high capacity. Flash memories mainly used in mobile electronic devices are representative memories that meet the demand. However, studies have been extensively made on random-access nonvolatile memory devices with improved performance. Such memory devices include, for example, ferroelectric random access memory (FRAM) using a ferroelectric capacitor, magnetic RAM (MRAM) using a tunneling magnetoresistive (TMR) layer, phase change memory device using chalcogenide alloys, resistive RAM (RRAM) using a variable resistance material layer as a data storage medium, and the like.

The above-mentioned nonvolatile memories include reference cells for identifying data stored in memory cells. Data stored in a memory cell may be precisely sensed with reference to data stored in a reference cell. Precision of a reference signal generated from a reference cell is required for high data integrity. However, a reference signal provided by reference cells may vary depending on various factors, which causes a read error.

SUMMARY OF THE INVENTION

Embodiments of the inventive concepts provide a nonvolatile memory device and a method for generating a reference signal of the nonvolatile memory device.

In an exemplary embodiment, a nonvolatile memory random access memory device may include a plurality of memory cells configured to store data therein; a plurality of reference cells separate from the memory cells the reference cells each configured to output a corresponding reference cell signal; and a read/write circuit which is configured to generate from the reference cell signals a reference signal which is variable to have a plurality of different reference levels. The read/write circuit is further configured, in response to the reference signal, to identify a logic state among a first logic state and a second logic state for each of one or more selected memory cells, and to output read data corresponding to the identified logic state.

In an exemplary embodiment, a method of reading data stored in a nonvolatile random access memory device may include: sensing selected memory cells according to a reference signal having a first reference level; ascertaining when there is an error in output data of the selected memory cells depending on a result of the sensing; and when the error is detected in the output data, changing the reference signal to have a second reference level different from the first reference level, and sensing the selected memory cells based on the reference signal having the second reference level different than the first reference level. The first and second reference levels are employed to identify a logic state of each of the selected memory cells among a first logic state and a second logic state, and are generated from reference cell signals output by reference cells respectively of the nonvolatile random access memory device.

In an exemplary embodiment, a nonvolatile random access memory device may include a cell array including a plurality of memory cells and a plurality of reference cells; a read/write circuit configured to generate a reference signal which is variable to have a plurality of different levels to identify a logic state among a first logic state and a second logic state or each of one or more selected memory cells among the plurality of memory cells; a read condition detector configured to sense one or more read conditions of the one or more selected memory cells and in response to the one or more sensed read conditions, to output one or more signals indicating the one or more sensed read conditions, and a control logic configured to control the read/write circuit such that the reference signals level of the reference signal is generated from the reference cells to sense the selected one or more memory cells in response to the one or more read conditions.

BRIEF DESCRIPTION OF THE DRAWINGS

Inventive concepts will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of inventive concepts.

DETAILED DESCRIPTION

Figure 1:
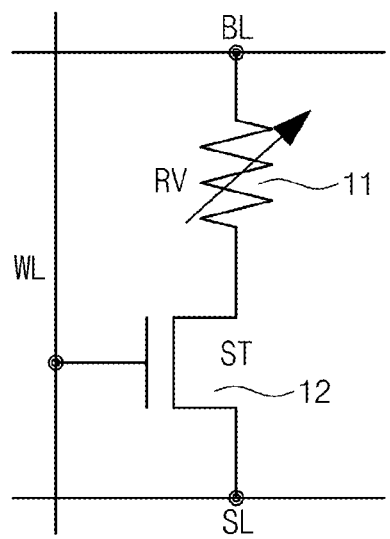
FIG. 1 is a circuit diagram illustrating the configuration of a nonvolatile memory device according to an embodiment of the inventive concept.

Exemplary embodiments of the inventive concepts will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein. Rather, these exemplary embodiments of the inventive concepts are provided so that this description will be thorough and complete, and will fully convey the concept of exemplary embodiments of the inventive concepts to those of ordinary skill in the art. In the drawings, the thicknesses of layers and regions are exaggerated for clarity.

Below, a magnetic random access memory (MRAM) is used as one example for illustrating characteristics and functions of the present invention. However, those skilled in the art can easily understand other advantages and performances of the present invention according to the descriptions. The present invention may be embodied or applied through other embodiments. Besides, the detailed description may be amended or modified according to viewpoints and applications, not being out of the scope, technical idea and other objects of the present invention.

FIG. 1 is a circuit diagram illustrating the configuration of a memory cell of a nonvolatile RAM according to an embodiment of the inventive concept. Referring to FIG. 1, a memory cell 10 includes a variable resistance unit (Rv) 11 and a selection transistor (ST) 12. In the discussion to follow, it will be assumed that memory cell 10 is a magnetic random access memory (MRAM) cell. An MRAM is a memory which stores a magnetic polarization state in a thin film of a magnetic substance, and shifts a magnetic polarization state by a magnetic field established according to a bitline current or wordline current to perform a write operation.

Although not shown, variable resistance unit (Rv) 11 may include a magnetic tunnel junction (MTJ) that comprises a pinned layer, a free layer, and a tunnel junction layer. The pinned layer may have a relatively greater thickness than the free layer. Accordingly, a magnetic polarization state of the pinned layer may be shifted when a strong magnetic field is applied to the pinned layer. Meanwhile, a magnetic polarization state may be shifted even by a relatively smaller magnetic field. The tunnel junction layer is disposed between the pinned layer and the free layer.

Variable resistance unit 11 has a resistance value that varies depending on magnetization directions of the pinned layer and the free layer. That is, when the magnetization directions of the pinned layer and the free layer are identical to each other (hereinafter referred to as "parallel state"), variable resistance unit 11 has a relatively low resistance value. On the other hand, when the magnetization directions of the pinned layer and the free layer are different from each other (hereinafter referred to as "anti-parallel state"), variable resistance unit 11 has a relatively high resistance value.

Selection transistor 12 may be turned ON or turned OFF according to the level of the wordline. During an access operation, variable resistance unit 11 may be activated or deactivated by turning selection transistor 12 ON and OFF.

Variable resistance unit 11 and selection transistor 12 of memory cell 10 may be driven under various bias conditions. Sensing current I flowing between a bitline BL and a source line SL may be determined by characteristics of variable resistance unit 11 and selection transistor 12. This means that an error may occur in a sensing operation through the sensing current I due to process variation, driving temperature, random noise or the like.

A nonvolatile memory device according to the inventive concept may provide a reference signal Vref which may be changed or adjusted to have one of various levels for the above-mentioned various conditions. That is, a sensing error that may occur when cell data is determined by comparing a memory cell's output voltage to a reference signal of a fixed level may be mitigated or prevented.

Figure 2:
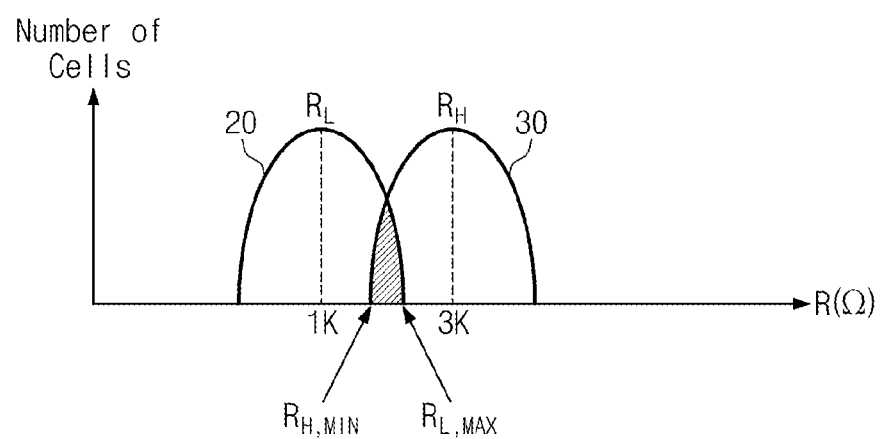
FIG. 2 illustrates a resistance distribution of a variable resistance unit in FIG. 1.

FIG. 2 briefly illustrates a resistance distribution of variable resistance unit 11 in FIG. 1. Referring to FIG. 2, a resistance state of the variable resistance unit 11 may be divided into a low resistance state ($R_L$) 20 and a high resistance state ($R_H$) 30.

Low resistance state 20 corresponds to a resistance state of variable resistance unit 11 when magnetization directions of the pinned layer and the free layer are identical to each other. For example, a log-scale distribution having an average of about 1 kilo ohm (1KΩ) may be observed when measuring resistance values of memory cells into which data corresponding to low resistance state 20 is written. High resistance state 30 corresponds to a resistance state of variable resistance unit 11 when magnetization directions of the pinned layer and the free layer are different from each other. A distribution having an average of about 3KΩ may be observed when measuring resistance values of memory cells into which data corresponding to high resistance state 30 is written.

However, the maximum $R_{L,MAX}$ of low resistance state 20 may be greater than the minimum $R_{H,MIN}$ of high resistance state 30 due to various conditions of low resistance state 20. Such non-uniformity of resistance value distribution of a memory cell may be overcome by improving the precision of a reference signal for sensing the memory cell. Toward this end, a reference signal corresponding to low resistance state 20 or high resistance state 30 may be provided with various levels. Thus, a sensing margin of memory cells may increase in a nonvolatile memory device.

Figure 3:
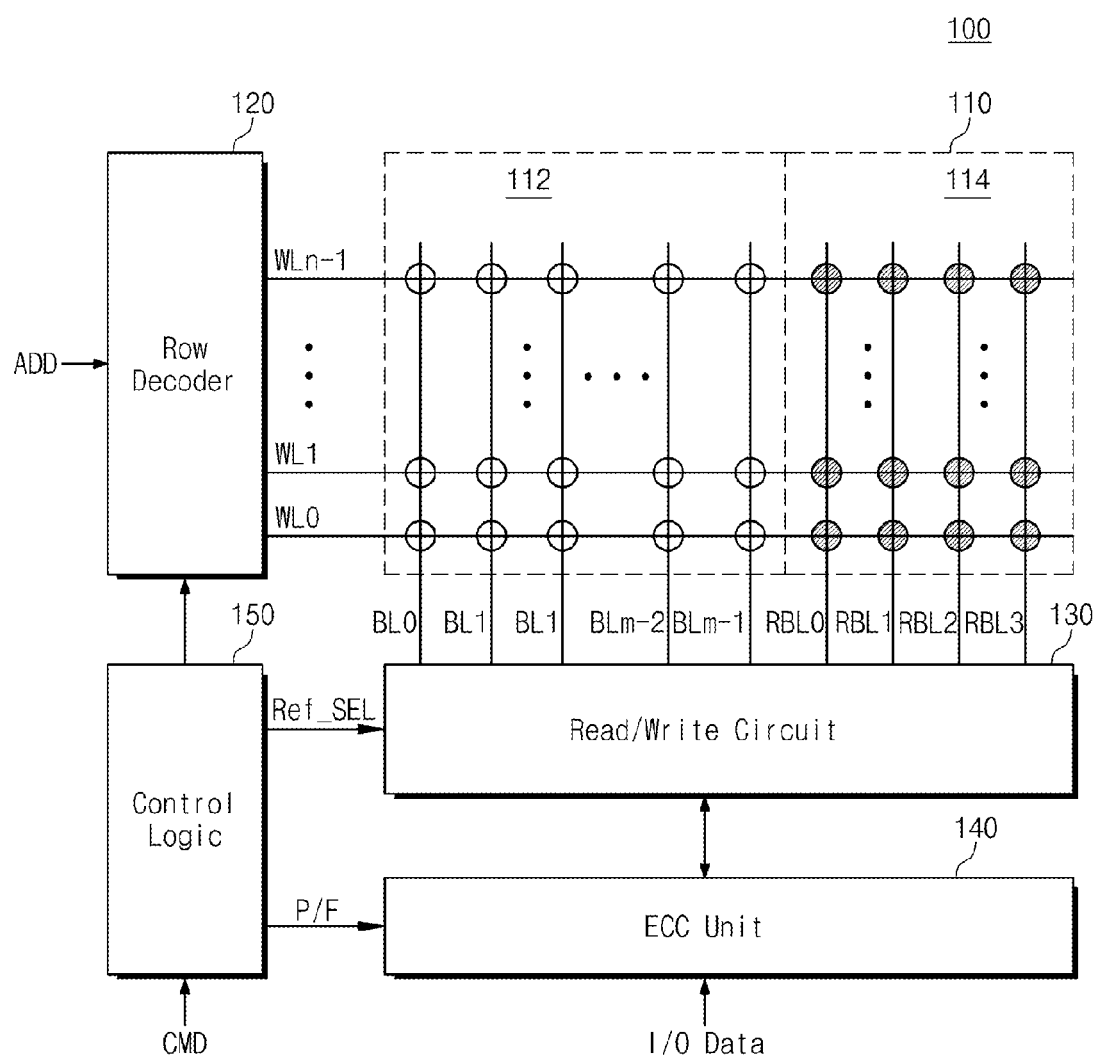
FIG. 3 is a block diagram of a nonvolatile memory device according to an embodiment of the inventive concept.

FIG. 3 is a block diagram of a nonvolatile memory device 100 according to an embodiment of the inventive concept. As illustrated, nonvolatile memory device 100 includes a cell array 110, a row decoder 120, a read/write circuit 130, an error code correction (ECC) unit 140, and a control logic 150.

Cell array 110 includes a plurality of memory cells that are connected to wordlines WL0~WLn-1 and bitlines BL0~BLm-1, respectively. Cell array 110 may be divided into a data cell region 112 which may have a plurality or memory cells formed therein, and a reference cell region 114 which may have a plurality of reference cells formed therein. The memory cells of data cell region 112 may also be referred to as "data cells" as they are configured to store data therein, in particular data provided from an external entity of nonvolatile memory device 100 As will be discussed in greater detail below, the reference cells formed in reference cell region 114 may be employed for providing a reference signal Vref. The data stored in data cell region 112 may be read with reference to the reference signal Vref. When a wordline WL1 is selected to output data, reference cells in reference cell region 114 may be selected to sense memory cells in data cell region 112.

Reference cells set to have a plurality of resistance values with respect to one logical value may be included in reference cell region 114. For example, a plurality of reference cells may be set to have a cell resistance corresponding to a logic '1' such that a reference cell signal corresponding to a logic '1' is generated. A plurality of reference cells storing logic '1' therein may be set to have different cell resistances, respectively. Similarly, a plurality of reference cells may be set to have a cell resistance corresponding to a logic '0' such that a reference cell signal corresponding to a logic '0' is generated. A plurality of reference cells storing logic '0' therein may be set to have difference cell resistances, respectively.

Row decoder 120 may select one of the wordlines WL0~WLn−1 in response to an address ADD. A gate voltage of a selection transistor of a memory cell selected by row decoder 120 may be supplied.

Read/write circuit 130 senses data of selected memory cells during a read operation. Read/write circuit 130 compares a sensing node voltage of each of bitlines BL0~BLm−1 of selected memory cells with a reference signal Vref generated from reference cells via one or more voltages received via reference bitlines RBL0, RBL1, RBL2 and RBL3 during the read operation. Read/write circuit 130 compares a level of the sensing node voltage of memory cells with a level of the reference signal Vref and latches a result of the comparison. Read/write circuit 130 generates the reference signal Vref with reference to a reference selection signal Ref_SEL provided from control logic 150. Read/write circuit 130 may select a reference cell for generating the reference signal Vref with reference to the reference selection signal Ref_SEL. Read/write circuit 130 may vary the level of a reference signal Vref for distinguishing resistance values corresponding to a logic '0' and a logic '1' depending on the reference selection signal Ref_SEL.

ECC unit 140 detects an error of read data sensed and output from read/write circuit 130 and corrects the detected error. For example, ECC unit 140 may perform encoding and decoding in a hamming code scheme capable of correcting a single error and detecting a double error. ECC unit 140 decodes read data provided from read/write circuit 130 to detect whether there is an error. ECC unit 140 may correct a correctable error. ECC unit 140 transfers a read pass flag to control logic 150 when there is no error or a correctable error is included in the read data. On the other hand, ECC unit 140 may transfer a read failure flag to control logic 150 when a correctable error is detected during error decoding.

Control logic 150 controls row decoder 120 and/or read/write circuit 130 to perform a read operation on selected memory cells in response to a command CMD. In particular, control logic 150 may select a level of the reference signal Vref for reading data of the selected memory cells. Control logic 150 may generate the reference selection signal Ref_SEL to generate a reference signal Vref corresponding to a default level in a normal read mode.

On the other hand, when receiving a read failure message from ECC unit 140, control logic 150 may generate the reference selection signal Ref_SEL to output a reference signal Vef with a voltage level which is greater than or less than the default level. As a result, read/write circuit 130 selects reference cells with higher or lower cell resistance than reference cells selected in a normal mode to generate a reference signal Vref.

Heretofore, there have been described the configuration and operation of the nonvolatile memory device 100 generating a reference signal which may have different levels to distinguish a single logical value. A plurality of reference cells corresponding to a single logic state or value (i.e., a logic '0' or a logic '1') may be set to have different resistances. However, it will be understood by those skilled in the art that a scheme for adjusting the level of a reference signal is not limited to the foregoing embodiment and various changes and modifications of the scheme may be made.

Figure 4:
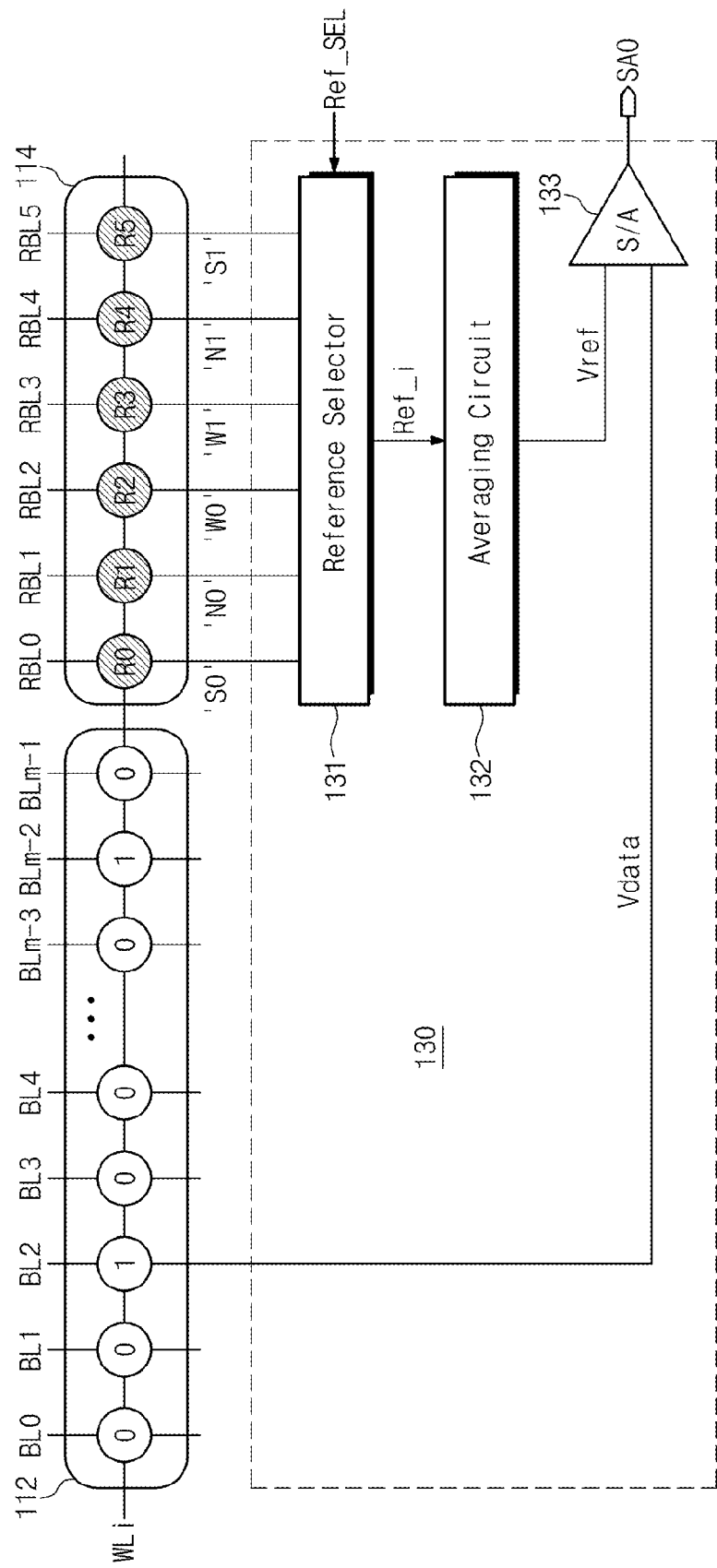
FIG. 4 illustrates the more detailed configuration of a reference cell region and a read/write circuit in FIG. 3.

FIG. 4 illustrates the more detailed configuration of reference cell region 114 and read/write circuit 130 in FIG. 3. As illustrated, read/write circuit 130 may select at least one pair of reference cells among reference cells R0, R1, R2, etc. in response to a reference selection signal Ref_SEL. Read/write circuit 130 includes a reference selector 131 to select the reference cells. In addition, read/write circuit 130 may include an averaging circuit 132 and a sense amplifier (S/A) 133. For brevity of explanation, in a cell array 110, only memory cells connected to one wordline WLi are shown.

Memory cells connected to m bitlines may be included in data cell region 112. Data of logic '1' or logic '0' may be stored in each of the memory cells. However, a memory cell may include a multi-level cell (MLC) in which two or more bits, i.e., multiple bits may be stored.

A plurality of reference cells R0, R1, R2, R3, R4, and R5 may be included in reference cell region 114 and connected to respective reference bitlines RBL0, RBL1, RBL2, RBL3, RBL4 and RBL5. For example, the reference cells R0, R1, and R2 may be set to a resistance value corresponding to logic '0' and the reference cells R3, R4, and R5 may be set to a resistance value corresponding to logic '1'. However, resistance values of the reference cells R0, R1, and R2 set to the resistance value corresponding to logic '0' are different from each other. The resistance value of the reference cell R0 is set to a resistance value corresponding to strong logic '0'. The reference cell R0 corresponding to strong logic '0' may provide a reference cell signal S0. The resistance value of the reference cell R1 is set to a resistance value corresponding to normal logic '0'. The reference cell R1 corresponding to normal logic '0' may provide a reference cell signal N0. The resistance value of the reference cell R2 is set to a resistance value corresponding to weak logic '0'. The reference R2 corresponding to weak logic '0' may provide a reference cell signal W0.

Resistance values of the reference cells R3, R4, and R5 set to the resistance value corresponding to logic '1' are also different from each other. The resistance value of the reference cell R3 is set to a resistance value corresponding to weak logic '1'. The reference cell R3 corresponding to weak logic '1' may provide a reference cell signal W1. The resistance value of the reference cell R4 is set to a resistance value corresponding to normal logic '1'. The reference cell R4 corresponding to normal logic '1' may provide a reference cell signal N1. The resistance value of the reference cell R5 is set to a resistance value corresponding to strong logic '1'. The reference cell R5 corresponding to strong logic '1' may provide a reference cell signal S1.

When a memory cell connected to a bitline BL2 of data cell region 112 is sensed, read/write circuit 130 receives a data signal Vdata provided from a sensing node corresponding to the bitline BL2. Reference selector 131 selects at least two of reference cells in response to the reference selection signal Ref_SEL. For example, reference selector 131 may select the reference cell signals N0 and N1 provided through bitlines of the reference cells of reference cell pair (R1, R4). However, the number of selected reference cells is not limited to the foregoing examples. A combination of various reference cells or all reference cells may be selected.

Averaging circuit 132 generates a reference signal or voltage Vref with reference to a selected combination Ref_i among the reference cell signals S0, N0, S0, S1, N1, and S1. Sense amplifier 133 compares the reference signal Vref and the sensing voltage Vdata to ascertain or determine data of a selected memory cell. The ascertained data may be output as a sensing output SAO.

Heretofore, there have been described reference cells set to have different resistance values with respect to the same logical value. And read/write circuit 130 including reference selector 131 to select an optimal combination of reference cells according to a read mode has been explained. The configuration of memory cells may prevent a read error caused by inaccuracy of the reference signal Vref of nonvolatile memory device 100.

Figure 5:
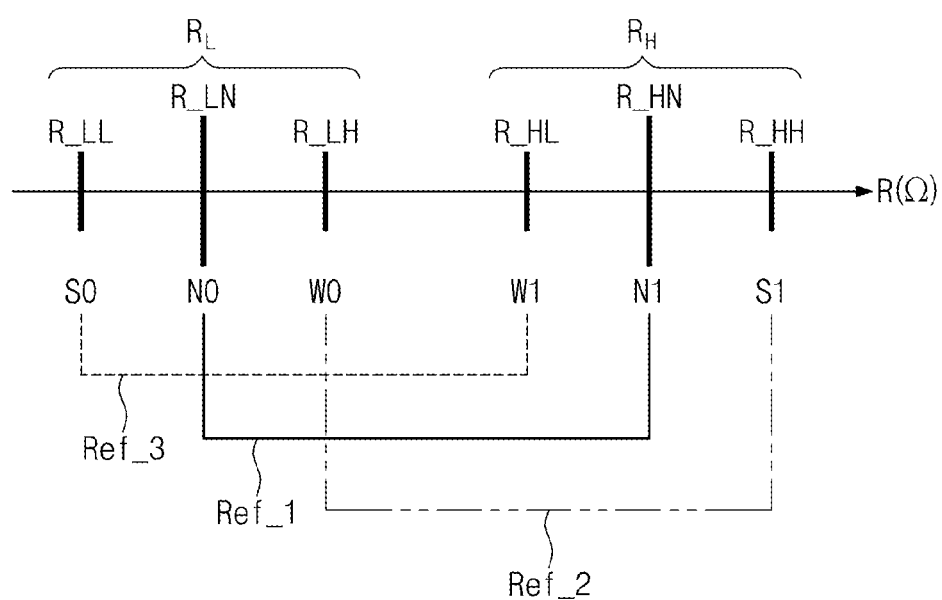
FIG. 5 shows resistance values of reference cells in FIG. 4.

FIG. 5 briefly shows resistance values of reference cells in FIG. 4. Referring to FIG. 5, the reference cells R0, R1, R2, R3, R4, and R5 are set to have resistance values of various levels.

First, reference cells R0, R1, and R2 may be set to resistance values R_LL, R_LN, and R_LH corresponding to logic '0'. According to the above example in FIG. 4, the reference cell R0 may be programmed to have the smallest resistance value R_LL. The reference cell R0 set to the resistance value R_LL may provide a reference cell signal S0 through the reference bitline RBL0. The reference cell R1 may be programmed to have the resistance value R_LN. The reference cell R1 set to the resistance value R_LN may provide a reference cell signal N0 through the reference bitline RBL1. The reference cell R2 may be programmed to have the resistance value R_LH. The reference cell R2 set to the resistance value R_LH may provide a reference cell signal W0 through the reference bitline RBL2.

The reference cells R3, R4, and R5 may be set to resistance values R_HL, R_HN, and R_HH corresponding to logic '1'. According to the above example in FIG. 4, the reference cell R3 may be programmed to have the resistance value R_HL. The reference cell R3 set to the resistance value R_HL may provide a reference cell signal W1 through a bitline RBL3. The reference cell R4 may be programmed to have the resistance value R_HN. The reference cell R4 set to the resistance value R_HN may provide a reference cell signal N1 through the reference bitline RBL4. The reference cell R5 may be programmed to have the resistance value R_HH. The reference cell R5 set to the resistance value R_HH may provide a reference cell signal S1 through the reference bitline RBL5.

Reference cells may be set to resistance values of various levels corresponding to the respective foregoing binary logic values '0' and '1'. Thus, a reference signal Vref having one of various levels may be generated through combinations of the reference cells. For example, the reference cells R1 and R4 having the resistance values R_LN and R_HN corresponding to a normal mode may be selected in the normal mode. In this case, reference cell signals (N0, N1=Ref_1) may be provided to the averaging circuit 132 from the reference cells R1 and R4. Meanwhile, when a resistance of a reference cell must decrease, the reference cells R0 and R3 may be selected. That is, the reference cells R0 and R3 having the resistance values R_LL and R_HL may be selected. Similarly, when a resistance of a reference cell must increase, the reference cells R2 and R5 may be selected. That is, the reference cells R2 and R5 having the resistance values R_LH and R_HH may be selected.

Figure 6:
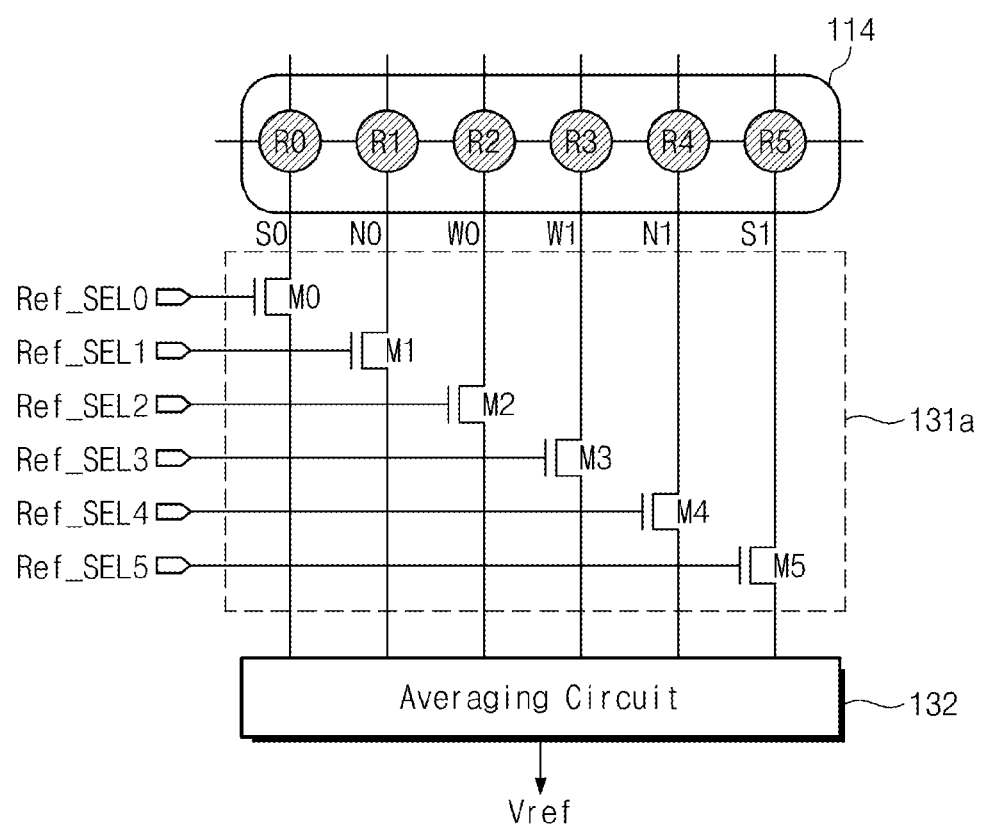
FIG. 6 is a block diagram illustrating the configuration of a reference selector according to an embodiment of the inventive concept.

FIG. 6 is a block diagram illustrating the configuration of a reference selector according to an embodiment of the inventive concept. Referring to FIG. 6, a reference selector 131a may connect reference cells in various combinations to averaging circuit 132 in response to reference selection signals Ref_SEL0~Ref_SEL5.

For example, control logic 150 may enable reference selection signals Ref_SEL1 and Ref_SEL4 to select the reference cells R1 and R4 having the resistances R_LN and R_HN corresponding to a normal mode, respectively. Thus, transistors M1 and M4 may be turned ON to connect the reference cells R1 and R4 to the averaging circuit 132. Similarly, reference selection signals Ref_SEL2 and Ref_SEL5 may be enabled to select the reference cells R2 and R5. Although examples have been explained where reference cells are selected for each pair, a reference selection signal Ref_SELj may connect two or more reference cells to averaging circuit 132. That is, at least three reference cells may be connected to averaging circuit 132 to provide an optimal level of reference signal Vref.

Figure 7:
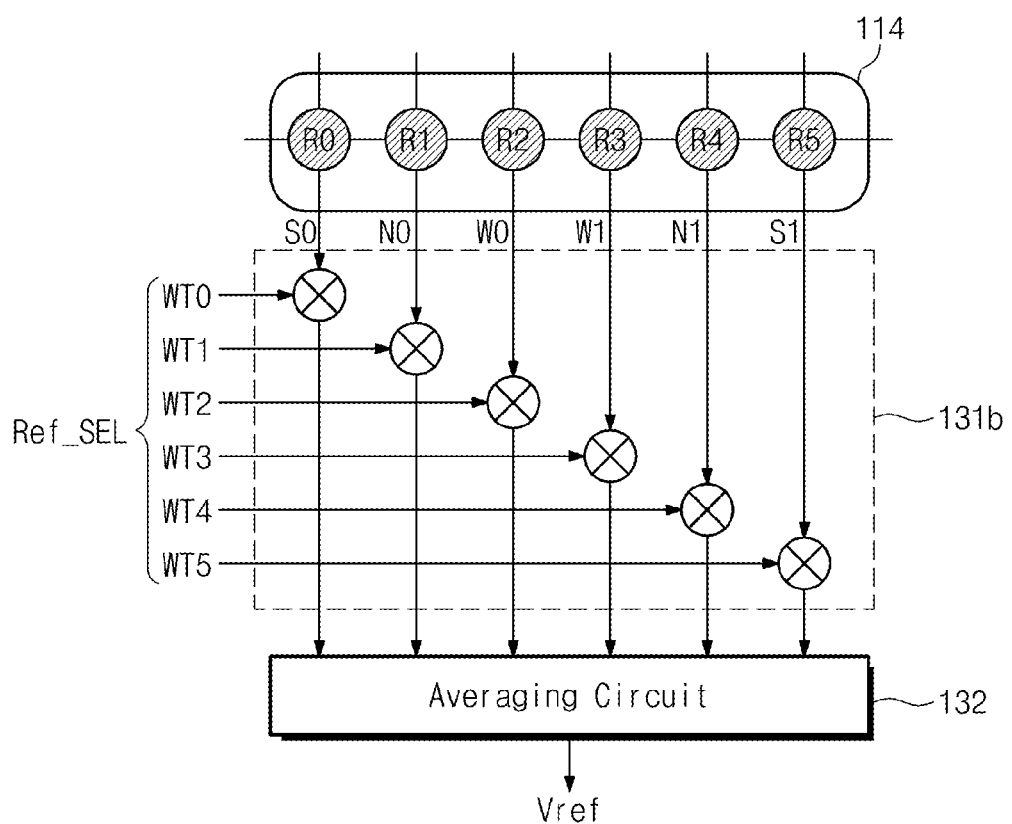
FIG. 7 is a block diagram illustrating the configuration of a reference selector according to another embodiment of the inventive concept.

FIG. 7 is a block diagram illustrating the configuration of a reference selector according to another embodiment of the inventive concept. Referring to FIG. 7, a reference selector 131b may provide a weight or weights corresponding to reference selection signals WT0~WT5 to a reference cell signal that each reference cell provides.

For example, control logic 150 may set weights WT1 and WT4 to maximum and the other weights WT0, WT2, WT3, and WT5 to zero ('0') to select the reference cells R1 and R4 having the resistance values R_LN and R_HN corresponding to a normal mode. Then only reference cell signals N0 and N1 provided from the reference cells R1 and R4 may be transmitted to averaging circuit 132. Similarly, control logic 150 may set the weights WT0 and WT3 to maximum and may set the other weights to zero ('0') to select the reference cells R0 and R3. In addition, levels of the weights WT0~WT5 may be provided with various values to generate a reference signal Vref having various different reference levels.

Figure 8:
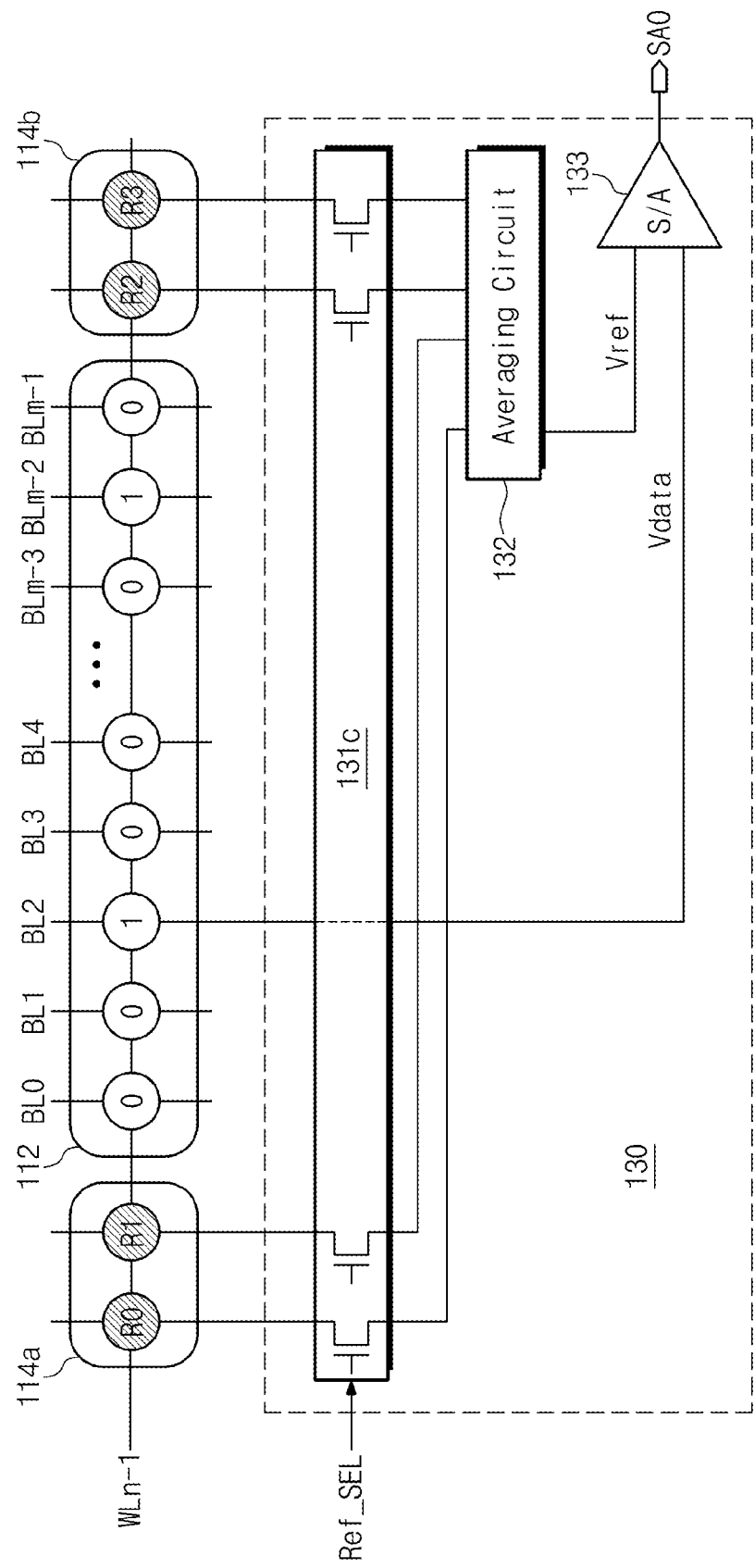
FIG. 8 is a block diagram illustrating the configuration of a reference selector according to another embodiment of the inventive concept.

FIG. 8 is a block diagram illustrating the configuration of a reference selector according to still another embodiment of the inventive concept. Referring to FIG. 8, a reference selector 131c may be selected depending on the location of a data cell to be selected or the magnitude of bitline resistance of a data cell.

Reference cells R0 and R1 may be set to relatively high resistance values for logical values of "0" and "1," respectively. For example, the reference cell R0 may be set to a resistance value R_LH corresponding to a weak logic '0' and the reference cell R1 may be set to a resistance value R_HH corresponding to a strong logic '1'. On the other hand, reference cells R2 and R3 may be set to relatively low resistances for logical values of "0" and "1," respectively. For example, the reference cell R2 may be set to a resistance value R_LL corresponding to a strong logic '0' and the reference cell R3 may be set to a resistance value R_HL corresponding to a weak logic '1.'

If a bitline resistance of a data cell selected for sensing is relatively high, then the reference cells R0 and R1 set to relatively high resistance values may be selected for generating a reference voltage. On the other hand, if a bitline resistance of a selected data cell is relatively low, then a reference cell pair (R2, R3) set to relatively low resistance values may be selected for generating a reference voltage. The magnitude of bitline resistance of a selected memory cell may be determined or ascertained through a column address.

Figure 9:
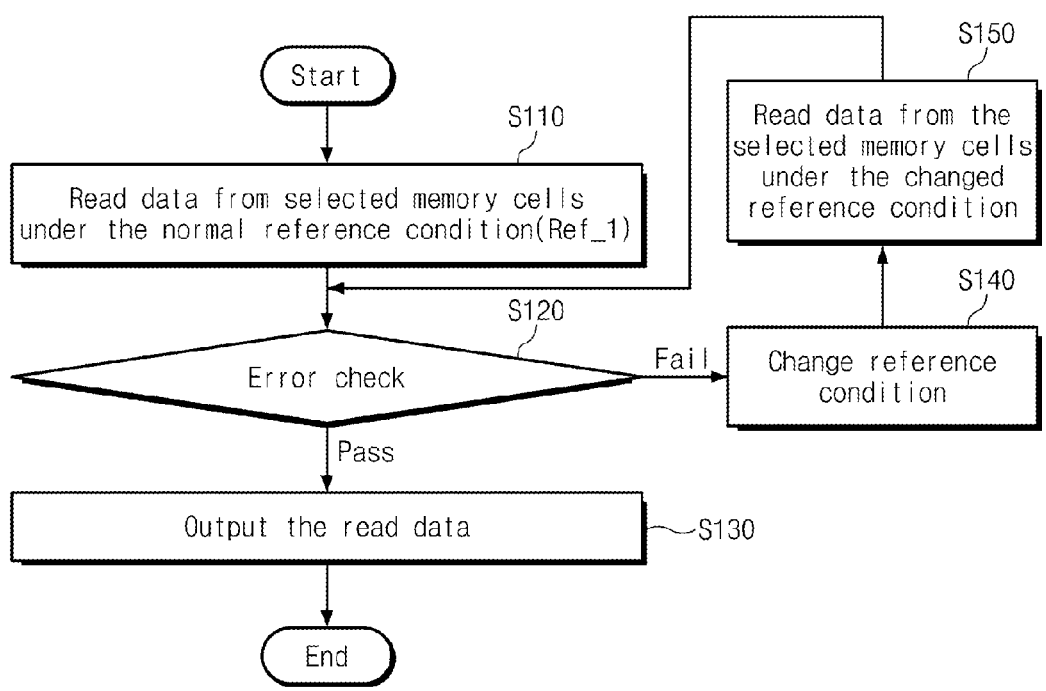
FIG. 9 is a flowchart illustrating a read method of a nonvolatile memory device according to an embodiment of the inventive concept.

FIG. 9 is a flowchart illustrating a read method of a nonvolatile memory device according to an embodiment of the inventive concept. Referring to FIG. 9, the overall read operation by control logic 150 (see FIG. 3) starts in response to a read command for data stored in selected memory cells.

At operation S110, data from selected memory cells may be read under the normal reference condition Ref_1 (see FIG. 5). At this point, reference cells selected for producing or generating a reference signal Vref may output reference cell signals corresponding to a default value. For example, a reference cell outputting a reference cell signal N0 and a reference cell outputting a reference cell signal N1 may be selected by a reference selection signal Ref_SEL provided by control logic 150.

At operation S120, error check may be performed on the read data by the reference signal Vref set to the default value. Error code correction (ECC) unit 140 (see FIG. 3) performs an error check on the read data. If there is no error in the read data, ECC unit 140 may determine the read data to be "read pass.". If there is an error in the read data but the error is correctable, ECC unit 140 may correct the checked error and determine the read data to be "read pass." In the case of the "read pass," ECC unit 140 transfers the "read pass" to control logic 150. The flow proceeds to operation S130.

If there is an uncorrectable error in the read data, ECC unit 140 may determine the read data to be "read failure." In the case of the "read failure," ECC unit 140 transfers the "read failure" to control logic 150. The flow proceeds to operation S140.

At operation S130, the read data determined to be "read pass" by the ECC unit 140 may be output to an external entity of nonvolatile memory device 100.

At operation S140, control logic 150 may change conditions for generation of the reference signal Vref for read data. That is, control logic 150 generates a reference selection signal Ref_SEL to select not the reference cells selected at S100 but other reference cells. As the reference selection signal Ref_SEL of control logic 150 is varied, the selected reference cells may also be varied and the level of the reference signal Vref may also be varied.

At operation S150, the selected memory cells may be read by the varied reference signal Vref. The flow returns to operation S120 at which point the error check may be performed on the read data output from the selected memory cells.

Heretofore, there has been described a read method for varying the level of a reference signal when an error occurs under setting conditions of reference cells according to an embodiment of the inventive concept.

Figure 10:
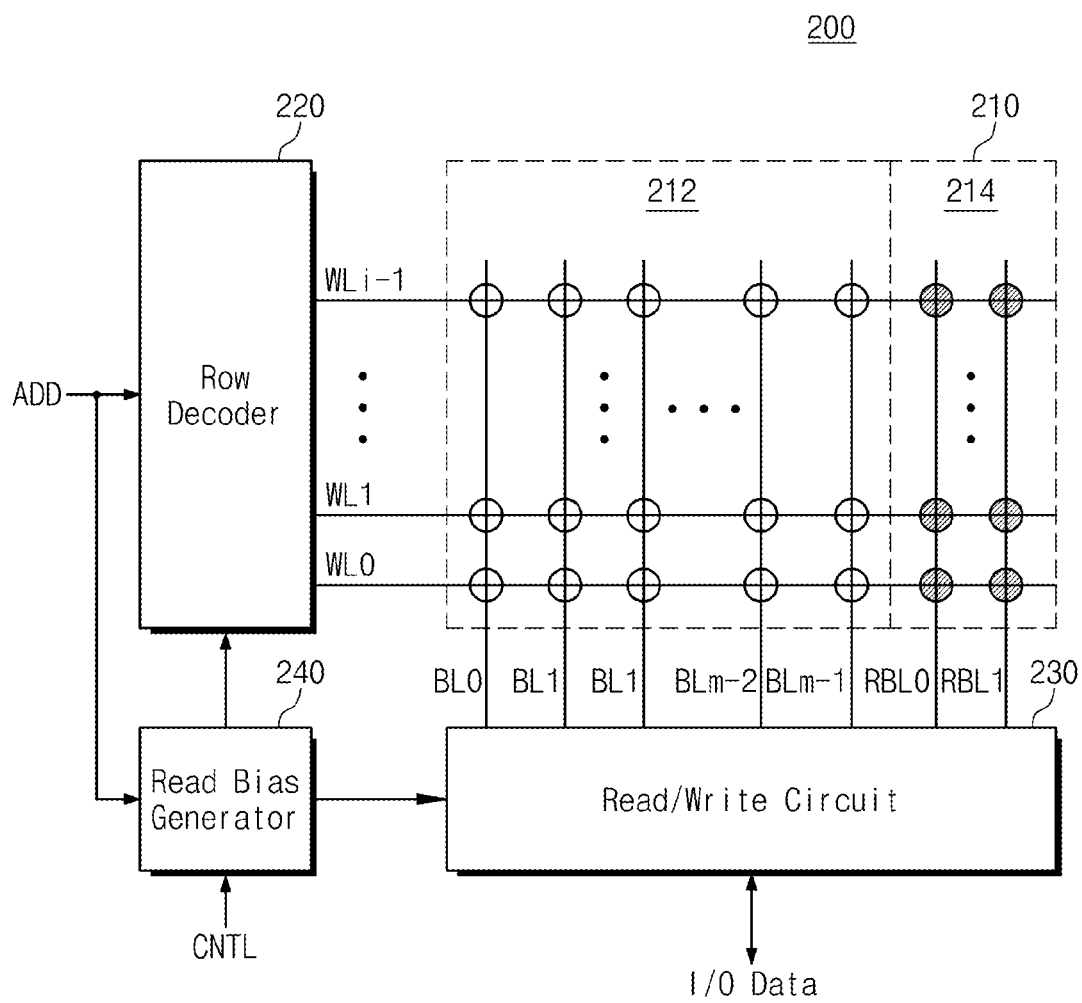
FIG. 10 is a block diagram of a nonvolatile memory device according to another embodiment of the inventive concept.

FIG. 10 is a block diagram of a nonvolatile memory device 200 according to another embodiment of the inventive concept. Nonvolatile memory device 200 may generate various levels of reference signal Vref by varying bias conditions for reference cells while resistance values of the reference cells are constant. As illustrated, nonvolatile memory device 200 includes a cell array 210, a row decoder 220, a read/write circuit 230, and a read bias generator 240.

Cell array 210 includes a data cell region 212 and a reference cell region 214. Externally provided data may be stored in data cell region 212, and reference cells may be included in reference cell region 214. A reference signal Vref for sensing the data stored in data cell region 212 may be generated through the reference cells.

In reference cell region 214, a resistance value of a reference cell corresponding to a logic '0' is set to a constant single resistance value R_L. Similarly, a resistance value of a reference cell corresponding to a logic '1' is set to a single resistance value R_H. The reference cells may be set in a different manner than that described in FIG. 3 in which memory cells are set to various resistance values for a single logic value.

Row decoder 220 may select one of wordlines WL0~WLn−1 in response to an address ADD. A gate voltage of a selection transistor of the memory cell selected by row decoder 120 may be supplied. Row decoder 220 may supply a wordline voltage according to a bias voltage supplied from read bias generator 240.

Read/write circuit 230 senses data of memory cells selected during a read operation. Read/write circuit 230 compares a sensing node voltage of respective bitlines BL0~BLm−1 of the memory cells selected during the read operation with a reference signal Vref generated from reference cells via one or more voltages received via reference bitlines RBL0 and RBL1. Read/write circuit 230 compares a level of a sensing node voltage of memory cells with a level of the reference signal Vref and latches a result of the comparison.

Read/write circuit 230 may sense reference cells according to a bias voltage supplied from read bias generator 240. That is, read/write circuit 230 may vary levels, such as pre-charge and clamping, for bitlines of reference cells according to the control of read bias generator 240. Thus, although resistance values of the reference cells may be constant for respective logic values, the level of an output reference signal Vref may be variously adjusted through variation of bias conditions.

Read bias generator 240 generates a bias voltage for reference cells. Read bias generator 240 may vary bias conditions for the reference cells with reference to a control signal CNTL or an address ADD. For example, read bias generator 240 may generate a bias for a corresponding reference cell in response to a read address for a memory cell formed at a specific location. That is, bias conditions of a reference cell may be adjusted to compensate for process variation or resistance variation of a data cell which results from its location. Such bias voltage variation may be achieved by the address ADD or the control signal CNTL. The control signal CNTL may be provided by a control logic (not shown) in response to occurrence of one or more errors when reading data.

Heretofore, there has been described nonvolatile memory device 200 to generate a reference signal Vref having various different reference levels through bias variation for reference cells having constant resistance values.

Figure 11:
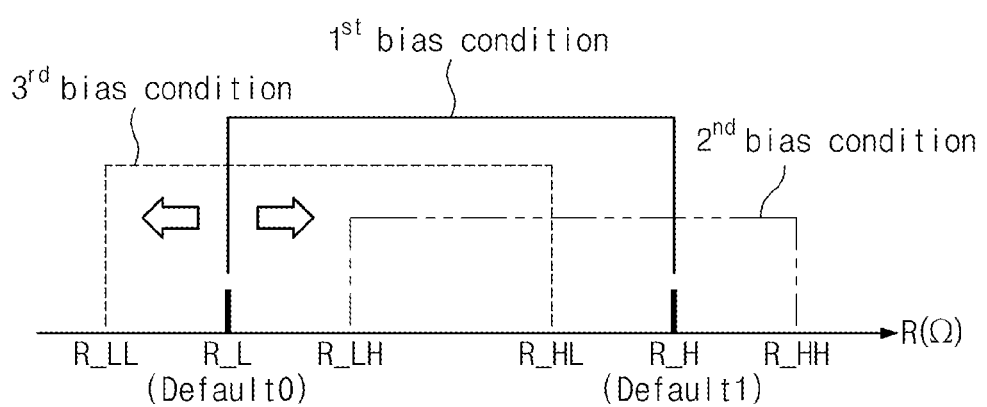
FIG. 11 shows resistance values of reference cells in an example embodiment of FIG. 10.

FIG. 11 shows resistance values of reference cells in an example embodiment of FIG. 10. Referring to FIG. 11, the reference cells may be set to have constant resistance values. However, a reference signal Vref of various levels may be generated by changing bias conditions for reference cells.

A reference cell set to a logic '0' may be set to have a resistance value R_L, and a reference cell set to a logic '1' may be set to have a resistance value R_H. That is, resistance values of reference cells corresponding to logic '0' and logic '1' may be measured to be R_L and R_H under a first bias condition of a default mode, respectively. However, a reference cell set to the resistance value R_L may be substantially measured to be a resistance value R_LH under a second bias condition. As a result, the resistance values of the reference cells corresponding to logic '0' and logic '1' may be R_LH and R_HH under the second bias condition, respectively. Similarly, the resistance values of the reference cells corresponding to logic '0' and logic '1' may be R_LL and R_HL under a third bias condition, respectively.

Heretofore, it has been described that a reference signal Vref having various different reference levels may be generated only by changing bias conditions for reference cells.

Figure 12:
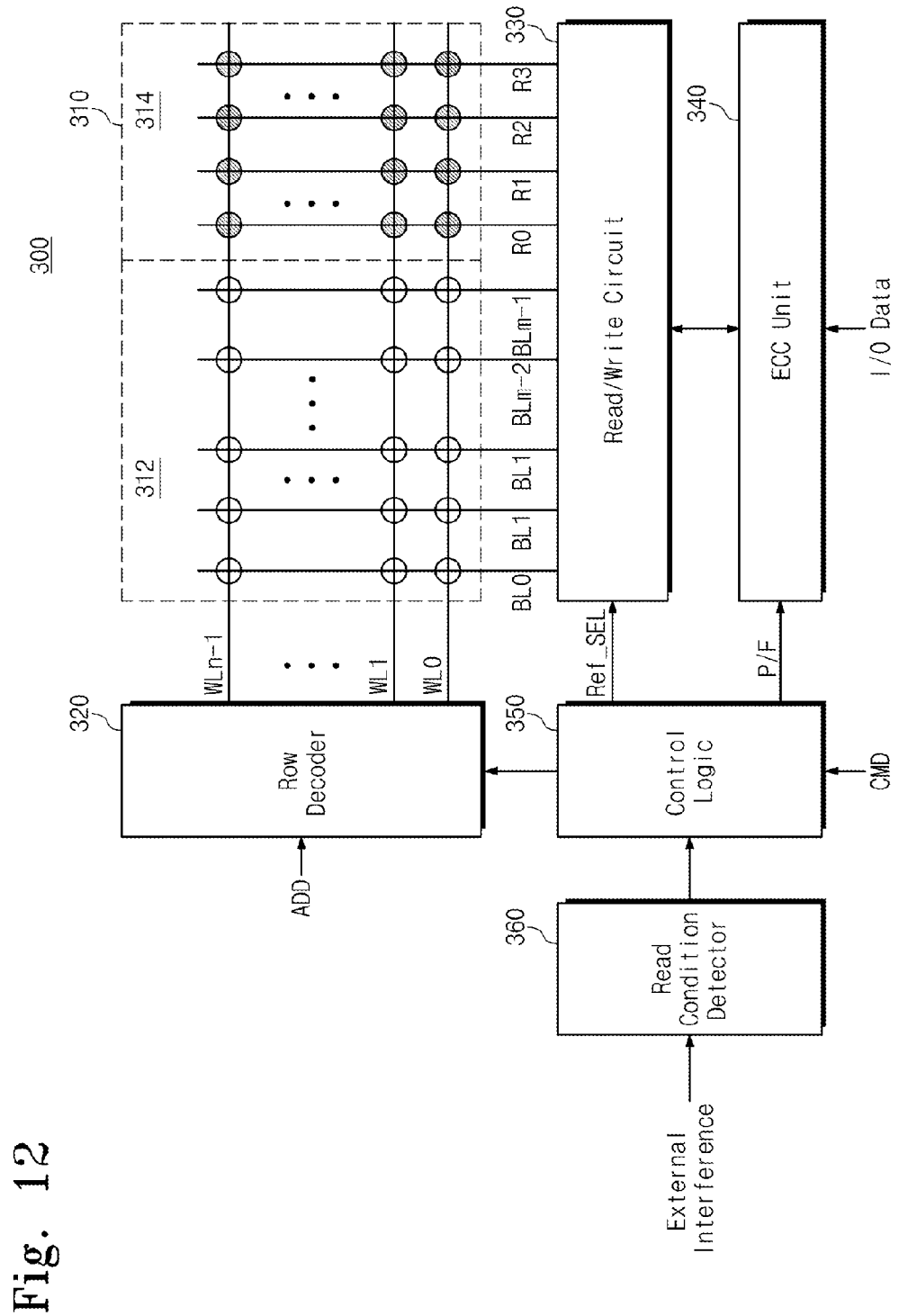
FIG. 12 is a block diagram of a nonvolatile memory device according to yet another embodiment of the inventive concept.

FIG. 12 is a block diagram of a nonvolatile memory device 300 according to yet another embodiment of the inventive concept. Nonvolatile memory device 300 may select optimal reference cells among a plurality of reference cells according to read conditions. In FIG. 12, a cell array 310, a row decoder 320, a read/write circuit 330, and an error code correction (ECC) unit 340 are identical to cell array 110, row decoder 120, read/write circuit 130, and ECC unit 140 in FIG. 3, respectively and will not be explained in further detail.

A read condition detector 360 detects one or more read conditions of nonvolatile memory device 300. For example, the read conditions may include a driving temperature of nonvolatile memory device 300, the intensity of leakage current of transistors, the magnitude of an electric field or a magnetic field introduced from the outside of nonvolatile memory device 300, and so on. Such an influence may cause a measurement error when reading data stored in an MTJ resistive element. Read condition detector 360 detects and the read condition(s) and in response thereto outputs one or more signals indicating the read condition(s) to control logic 350.

Control logic 350 may output a reference selection signal Ref_SEL in response to the read condition signal(s) provided from read condition detector 360. That is, for example, when the read condition corresponds to the driving temperature, a reference selection signal Ref_SEL may be generated to select a set of reference cells among reference cells that are set to different resistance values depending on a plurality of reference temperatures.

Figure 13:
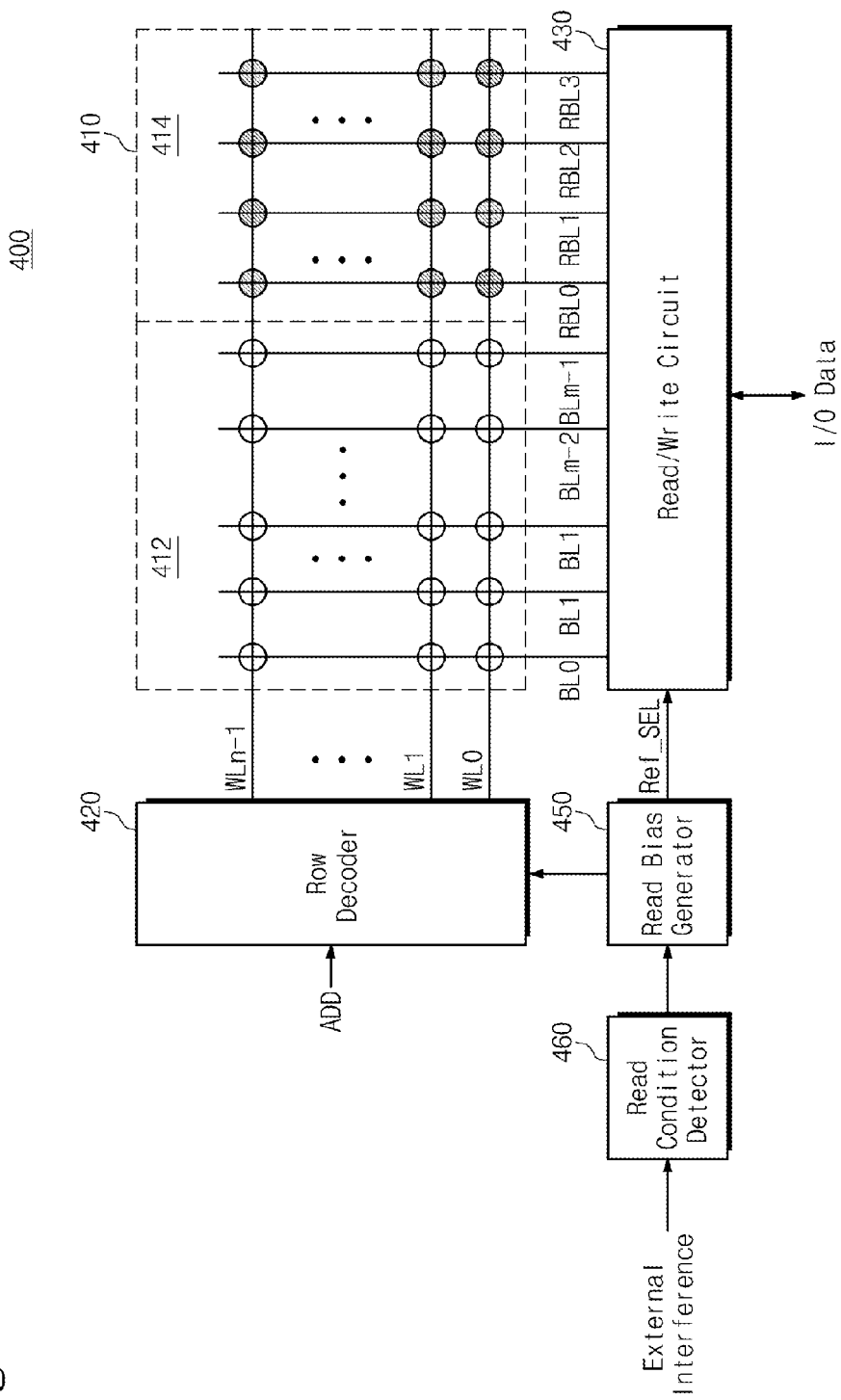
FIG. 13 is a block diagram of a nonvolatile memory device according to still another embodiment of the inventive concept.

FIG. 13 is a block diagram of a nonvolatile memory device 400 according to still another embodiment of the inventive concept. Nonvolatile memory device 400 may apply various bias settings to reference cells set to a single resistance value for logic '0' or logic '1' according to read conditions. Thus, a reference signal Vref having various different reference levels may be generated. In FIG. 13, a cell array 410, a row decoder 420, a read/write circuit 430, and an error code correction (ECC) unit (not shown) are identical to cell array 110, row decoder 120, read/write circuit 130, and ECC unit 140 in FIG. 3, respectively and will not be explained in further detail.

A read condition detector 460 detects one or more read conditions of nonvolatile memory device 400. For example, the read conditions may include a driving temperature of nonvolatile memory device 400, the intensity of leakage current of transistors, the magnitude of an electric field or a magnetic field introduced from the outside of nonvolatile memory device 400, and so on. Such an influence may cause a measurement error when reading data stored in an MTJ resistive element. Read condition detector 460 detects s the read condition(s) and in response thereto outputs one or more signals indicating the read condition(s) to read bias generator 450.

Read bias generator 450 may generate a sensing bias for reference cells in response to read conditions provided from read condition detector 460. The sensing bias for reference cells may be provided to row decoder 420 or read/write circuit 430. Biases of various conditions may be provided to reference cells set to a single resistance value for a single logic value to generate a reference signal Vref having various different reference levels.

Figure 14:
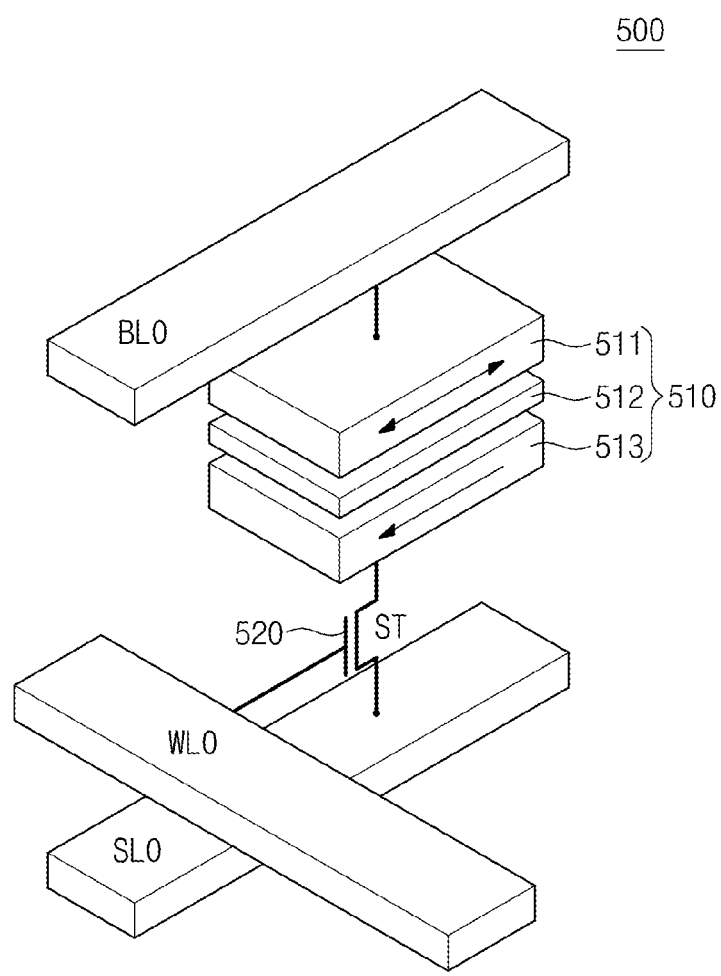
FIGS. 14 to 16 each illustrate a memory cell included in a nonvolatile memory device according to the inventive concept.
Figure 15:
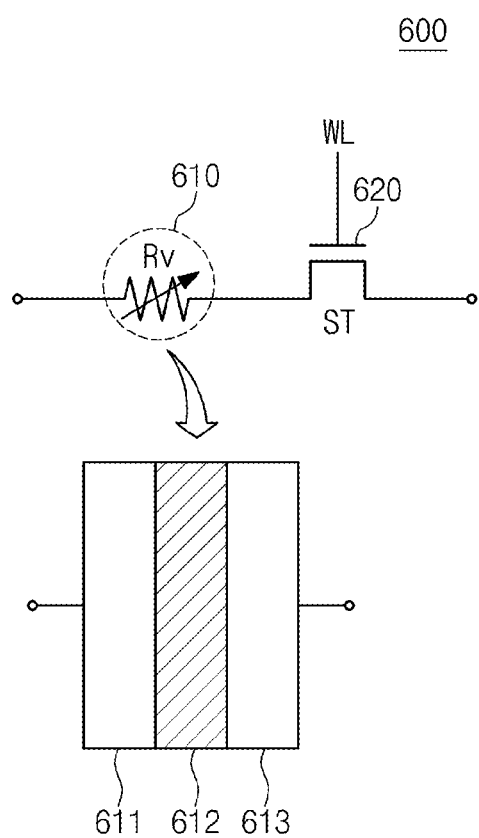
Figure 16:
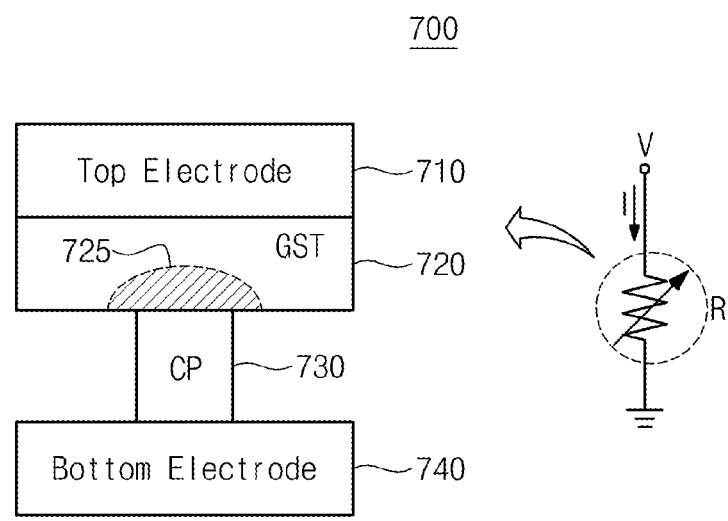

FIGS. 14 to 16 each illustrate an example embodiment of a memory cell included in a nonvolatile memory device according to the inventive concept. Specifically, FIG. 14 illustrates a memory cell 500 of a spin transfer torque magnetoresistive random access memory (hereinafter referred to as "STT-MRAM") as a memory cell of each of nonvolatile memory devices 100, 200, 300, and 400. Memory cell 500 may include an MTJ element 510 and a selection transistor (ST) 520. A wordline WL0 may be connected to a gate of selection transistor 520. One end of selection transistor 520 may be connected to a bitline BL0 via MTJ element 510, and the other end thereof may be connected to a source line SL0.

MTJ element 510 may include a pinned layer 513, a free layer 511, and a tunnel layer 512 disposed therebetween. A magnetization direction of pinned layer 513 may be fixed, and a magnetization direction of free layer 511 may be identical to, or reverse to that of, pinned layer 513 according to conditions. For example, an anti-ferromagnetic layer (not shown) may be provided to pin the magnetization direction of pinned layer 513.

A write operation of memory cell 500 of the STT-MRAM may be performed by applying a voltage to the wordline WL0 to turn on selection transistor 520 and applying write current between the bitline BL0 and the source line SL0. A read operation of memory cell 500 may be performed by applying a turn-on voltage to the wordline WL0 to turn on selection transistor 520 and applying read current from the bitline BL0 in a direction of the source line SL0 to determine data stored in MTJ element 510 according to a measured resistance value.

FIG. 15 is a circuit diagram of a memory cell 600 in a resistive memory device. As illustrated, memory cell 600 includes a variable resistive element (Rv) 610 and a selection transistor (ST) 620.

Variable resistive element 610 includes a variable resistive material to store data. The selection transistor 620 may supply current to variable resistive element 610, or cut off the supply of current, depending on a bias of a wordline WL. As shown, selection transistor 620 may include an NMOS transistor. However, the selection transistor 620 may include a PMOS transistor or one of switching elements such as a diode.

Variable resistive element (Rv) 610 includes a pair of electrodes (611, 631) and a data storage layer 612 disposed therebetween. Data storage layer 612 may be made of a bipolar resistance memory material or a unipolar resistance memory material. The bipolar resistance memory material may be programmed to a set or reset state by the polarity of a pulse applied thereto. The unipolar resistance memory material may include single transition metal oxide such as $NiO_x$ or $TiO_x$. The bipolar resistance memory material may include Perovskite-based materials.

FIG. 16 illustrates a memory cell 700 of a phase change memory device as an example of a nonvolatile memory device according to the inventive concept. As illustrated, memory cell 700 of a phase change memory device includes a resistive element. FIG. 16 shows a resistive element R of a phase change memory cell. The resistive element R may have a variable resistance value according to an applied current I. Referring to a cross-sectional view of the resistive element R, the resistive element R includes a top electrode 710, a phase change material 720, a contact plug 730, and a bottom electrode 740. Top electrode 710 may be connected to a bitline BL, and bottom electrode 740 may be coupled between contact plug 730 and an access transistor or diode (not shown). Contact plug 730 may be formed of a conductive material (e.g., TiN) and may be also called a heater plug. Phase change material 720 may be provided between top electrode 710 and contact plug (CP) 730. A phase of phase change material 720 may be changed according to amplitude, duration, and/or fall time of an applied current pulse. A phase of the phase change material corresponding to a set or reset may be determined according to an amorphous volume 725 as illustrated in FIG. 16. In general, an amorphous phase and a crystal phase correspond to a reset state and a set state, respectively. An amorphous volume may be reduced as a phase is changed from an amorphous state to a crystal state. Phase change material 720 has a resistance which may be changed according to the formed amorphous volume 725. That is, written data may be determined according to amorphous volume 725 of phase change material 720 formed according to different current pulses.

Heretofore, an STT-MRAM, an RRAM, and a PRAM have been briefly introduced as examples of memory cells constituting a nonvolatile memory device according to an embodiment of the inventive concept. However, it will be understood that memory cells constituting a nonvolatile RAM according to the inventive concept are not limited thereto. That is, a memory cell of a nonvolatile RAM may be provided in the form of a flash memory or an FRAM.

Figure 17:
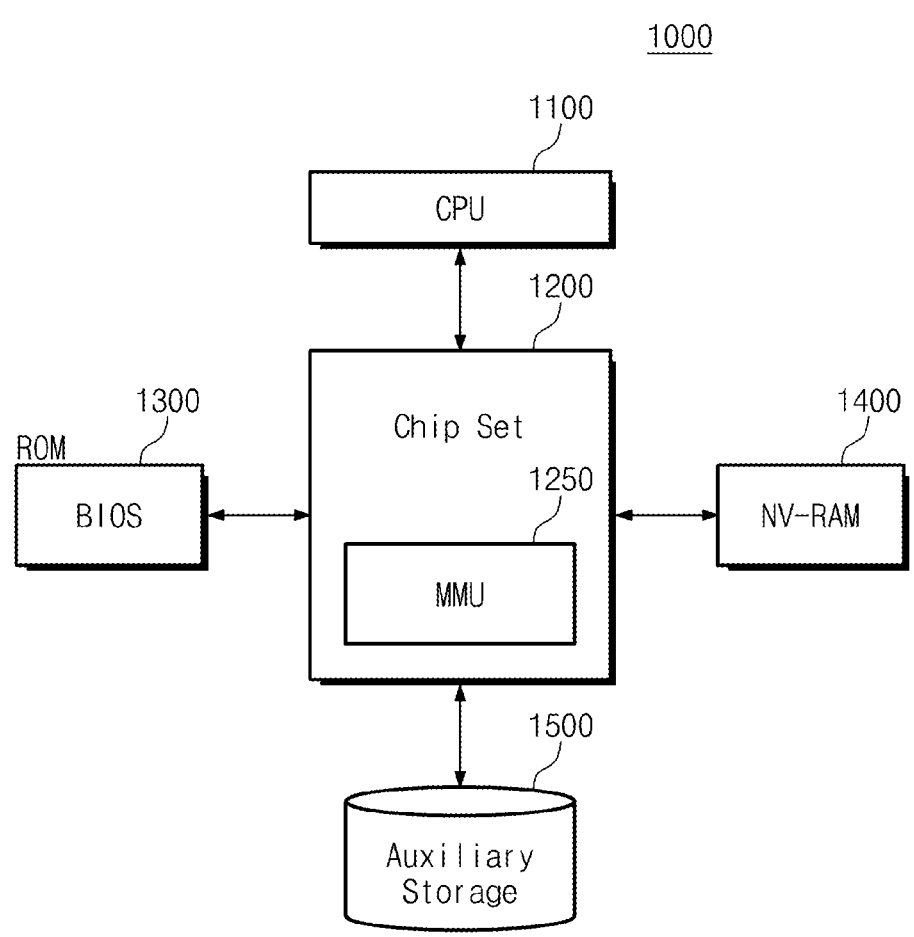
FIG. 17 is a block diagram of a user device according to an embodiment of the inventive concept.

FIG. 17 is a block diagram of a user device 1000 according to an embodiment of the inventive concept. As illustrated, user device (e.g., computer system) 1000 includes a central processing unit (CPU) 1100, a chipset 1200, a ROM 1300, a nonvolatile RAM (NV-RAM) 1400, and an auxiliary storage 1500. Nonvolatile RAM 1400 may be provided as a main memory or a working memory of user device 1000.

CPU 1100 reads a basic input/output system (BIOS) or an operating system (OS) from ROM 1300 or auxiliary storage 1500 and executes the BIOS or the OS. During a booting operation, CPU 1100 reads a boot program (or boot strap) from ROM 1300 and executes the boot program (or boot strap). CPU 1100 executes an operation to process data of user device 1000. At booting, CPU 1100 accesses auxiliary storage 1400 according to a fixed sequence to drive a program such as OS. CPU 1100 may control auxiliary storage 1500 and a memory management unit (MMU) to read OS data stored in auxiliary storage 1400 and store the read OS data in nonvolatile RAM 1400. This control operation is merely exemplary, and CPU 1100 may manage the overall control operation for user device 1000.

Chipset 1200 controls various components mounted on user device 1000. A plurality of control circuits may be embedded in chipset 1200 to control the components mounted on user device 1000. In particular, chipset 1200 may include a memory management unit (MMU) 1250 to control nonvolatile RAM 1400.

Chipset 1200 may be subdivided into two chipsets such as a north bridge and a south bridge. The north bridge may be disposed near CPU 1100 and control CPU 1100 and nonvolatile RAM 1400. In this case, memory management unit 1250 may be incorporated in the north bridge. Although not shown, expansion card slots for high-speed devices such as AGP and PCI express may be controlled by the north bridge.

The south bridge is disposed relatively remote from CPU 1100, as compared to the north bridge. While the north bridge controls an operation-associated device, the north bridge is mainly used to control an input/output device. The south bridge plays a role in controlling an IDE/SATA port to which a hard disk drive (HDD) or an optical disk drive (ODD), an USB port to which a keyboard or a mouse is connected, a PCI slot such as a LAN card or a sound card, and the like. However, the role and the configuration of chipset 1200 are not limited to the above explanation. In some recent cases, a memory management unit (MMU) may be incorporated in CPU 1100.

ROM 1300 may store a BIOS. The BIOS supports the most basic processing routines of user device 1000. The BIOS includes, for example, a start-up routine, a service processing routine, and a hardware interrupt processing routine. The start-up routine performs POST and initialization operations. The service processing routine processes an operation that an OS or an application program requests.

Nonvolatile RAM 1400 may be driven in user device 1000 as a main memory or a working memory. Similar to a DRAM, nonvolatile RAM 1400 may be a nonvolatile memory device that may be capable of performing byte access and rewriting data. An OS, an application program that is under execution, updated data, etc. may be stored in nonvolatile RAM 1400 used as a working memory when user device 1000 is driven. Nonvolatile RAM 1400 may be provided in a multi-chip form. Nonvolatile RAM 1400 to generate a reference signal Vref according to an embodiment of the inventive concept may provide high data integrity in spite of noise entering from the outside, variation of temperature and process, or the like.

Auxiliary storage 1500 may store user data, an OS, and data such as an application program. Auxiliary storage 1500 may be one of a hard disk drive (HDD), a solid state drive (SSD), and a hybrid HDD. As a mass storage, auxiliary storage 1500 may store a program driven in user device 1000 or code or setting data. However, it will be understood that auxiliary storage 1500 is not limited to the above-mentioned examples.

User device 1000 may further include a user interface, a battery, a modem, and the like. Although not shown, it should be apparent to those of ordinary skill in the art that user device 1000 may further include an application chipset, a camera image processor (CIS), a mobile dynamic random access memory (DRAM), and the like.

According to user device 1000 of the inventive concept, nonvolatile RAM 1400 may maintain high data integrity while decreasing the number of reference cells. Thus, nonvolatile RAM 1400 may be provided as a working memory with high capacity and high data integrity.

A nonvolatile RAM according to the inventive concept may be packaged as one of various types to be subsequently embedded. For example, a flash memory device and/or a memory controller according to the inventive concept may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

As described so far, a data error resulting from instability of a reference signal can be suppressed to achieve high data integrity of a nonvolatile memory device.

While the inventive concepts have been particularly shown and described with reference to exemplary embodiments thereof, it will be apparent to those of ordinary skill in the art that various changes in form and detail may be made therein without departing from the spirit and scope of the inventive concepts as defined by the following claims.

What is claimed is:

1. A nonvolatile random access memory device, comprising:
    a plurality of memory cells configured to store data therein;
    a plurality of reference cells separate from the memory cells, the reference cells each configured to output a corresponding reference cell signal;
    a read/write circuit which is configured to generate from the reference cell signals a reference signal which is variable to have a plurality of different reference levels, wherein the read/write circuit is further configured to identify, in response to the reference signal, a logic state among a first logic state and a second logic state for each of one or more selected memory cells, and to output read data corresponding to the identified logic state;

an error code correction unit configured to detect and correct an error of the read data output from the read/write circuit; and a control circuit configured to provide to the read/write circuit a reference selection signal for adjusting the reference level of the reference signal in response to a result of the error detection of the error code correction unit.

2. The nonvolatile random access memory device of claim 1, wherein the reference cells include a first reference group having cell resistances of different magnitudes corresponding to the first logic state, and a second reference group having cell resistances of different magnitudes corresponding to the second logic state.

3. The nonvolatile random access memory device of claim 2, wherein the read/write circuit comprises:

a reference selector configured to select at least one reference cell from the first reference group and at least one reference cell from the second reference group in response to the reference selection signal;

an averaging circuit configured to perform an averaging operation for the reference cell signals provided from reference bitlines of respective reference cells selected by the reference selector to output a result of the averaging operation as the reference signal; and a sense amplifier configured to compare a data signal transmitted to a bitline of each of the selected memory cells with the reference signal to output a result of the comparison as read data.

4. The nonvolatile random access memory device of claim 3, wherein the reference selector processes the reference cell signals provided from the reference cells from the first and second reference groups according to a weight corresponding to the reference selection signal.

5. A nonvolatile random access memory device, comprising:

a plurality of memory cells configured to store data therein;

a plurality of reference cells separate from the memory cells, the reference cells each configured to output a corresponding reference cell signal;

a read/write circuit which is configured to generate from the reference cell signals a reference signal which is variable to have a plurality of different reference levels, wherein the read/write circuit is further configured to identify, in response to the reference signal, a logic state among a first logic state and a second logic state for each of one or more selected memory cells, and to output read data corresponding to the identified logic state, wherein the reference cells include a first reference cell having a first cell resistance corresponding to the first logic state and a second reference cell having a second cell resistance corresponding to the second logic state; and a read bias generator configured to change a first read bias for the first reference cell and a second read bias for the second reference cell in response to a control signal, wherein the read bias generator adjusts at least one of a wordline voltage of the first reference cell and the second reference cell, a pre-charge voltage of a bitline, and clamping voltages, in response to the control signal.

6. The nonvolatile random access memory device of claim 1, wherein the memory cells and the reference cells are formed of at least one of a magnetoresistive random access memory (MRAM), a phase change memory (PRAM), and a resistive random access memory (RRAM).

7. A method of reading data stored in a nonvolatile random access memory device, comprising:

sensing selected memory cells according to a reference signal having a first reference level;

ascertaining when there is an error in output data of the selected memory cells depending on a result of the sensing; and when the error is detected in the output data, changing the reference signal to have a second reference level different from the first reference level, and sensing the selected memory cells based on the reference signal having the second reference level different than the first reference level, wherein the first and second reference levels are employed to identify a logic state of each of the selected memory cells among a first logic state and a second logic state of the memory cells and are generated from reference cell signals output by reference cells of the nonvolatile random access memory device.

8. The method of claim 7, wherein the first reference level is generated from a first reference cell signal output to a first reference bitline of a first reference cell and from a second reference cell signal output to a second reference bitline of a second reference cell, and wherein the second reference level is generated from a third reference cell signal output to a third reference bitline of a third reference cell and from a fourth reference cell signal output to a fourth reference bitline of a fourth reference cell, respectively.

9. The method of claim 8, wherein the first reference signal is generated through an averaging operation of the first reference cell signal output to the first reference bitline of the first reference cell and the second reference cell signal output to the second reference bitline of the second reference cell, and wherein the second reference signal is generated through an averaging operation of the third reference cell signal output to the third reference bitline of the third reference cell and the fourth reference cell signal output to the fourth reference bitline of the fourth reference cell.

10. The method of claim 7, further comprising:

sensing one or more read conditions, including at least one of: a driving temperature of the nonvolatile random access memory device, an intensity of a leakage current of a transistor of the nonvolatile random access memory device, a magnitude of an electric field introduced from outside the nonvolatile random access memory device, and a magnitude of a magnetic field introduced from outside the nonvolatile random access memory device; and in response to the one or more sensed read conditions, adjusting at least one of the first and second reference levels by averaging various selected ones of the reference cell signals output by the reference cells.

11. The method of claim 7, further comprising:

sensing one or more read conditions, including at least one of: a driving temperature of the nonvolatile random access memory device, an intensity of a leakage current of a transistor of the nonvolatile random access memory device, a magnitude of an electric field introduced from outside the nonvolatile random access memory device, and a magnitude of a magnetic field introduced from outside the nonvolatile random access memory device; and in response to the one or more sensed read conditions, adjusting at least one of the first and second reference levels by changing bias conditions of the reference cells.

12. The method of claim 7, wherein the first reference level is generated from a first reference cell signal output to a first reference bitline of a first reference cell while a first bias is applied to the first reference cell and from a second reference cell signal output to a second reference bitline of a second reference cell while a second bias is applied to the second reference cell, and wherein the second reference level is generated from the first reference cell signal output to the first reference bitline of the first reference cell while a third bias is applied to the first reference cell and from the second reference cell signal output to the second reference bitline of the second reference cell while a fourth bias is applied to the second reference cell.

13. A nonvolatile random access memory device comprising:
    a cell array including a plurality of memory cells and a plurality of reference cells;
    a read/write circuit configured to generate a reference signal which is variable to have a plurality of different reference levels to identify a logic state among a first logic state and a second logic state for each of one or more selected memory cells among the plurality of memory cells;
    a read condition detector configured to sense one or more read conditions of the one or more selected memory cells and in response to the one or more sensed read conditions, to output one or more signals indicating the one or more sensed read conditions; and
    a control logic configured to control the read/write circuit such that the reference level of the reference signal is generated from the reference cells to sense the one or more selected memory cells in response to the one or more sensed read conditions.

14. The nonvolatile random access memory device of claim 13, wherein the control logic controls the read/write circuit to select reference cells having different cell resistances when the read conditions are changed.

15. The nonvolatile random access memory device of claim 13, wherein the reference cells include a first reference group having cell resistances of different magnitudes corresponding to the first logic state, and a second reference group having cell resistances of different magnitudes corresponding to the second logic state.

16. The nonvolatile random access memory device of claim 13, wherein the one or more sensed read conditions of the one or more selected memory cells comprise at least one of: a driving temperature of the nonvolatile random access memory device, an intensity of a leakage current of a transistor of the nonvolatile random access memory device, a magnitude of an electric field introduced from outside the nonvolatile random access memory device, and a magnitude of a magnetic field introduced from outside the nonvolatile random access memory device.

17. The nonvolatile random access memory device of claim 13, further comprising a read bias generator configured to change a read bias for at least one of the reference cells in response to a control signal.

* * * * *